United States Patent [19]

Purcell et al.

[11] Patent Number: 4,602,231

[45] Date of Patent: Jul. 22, 1986

[54] SPACED STABILIZING MEANS FOR A SUPERCONDUCTING SWITCH

[75] Inventors: John R. Purcell, San Diego; Yen-hwa Hsu, Solana Beach, both of Calif.

[73] Assignee: GA Technologies Inc., San Diego, Calif.

[21] Appl. No.: 632,813

[22] Filed: Jul. 20, 1984

[51] Int. Cl.⁴ .............................................. H01F 7/22
[52] U.S. Cl. ................................ 335/216; 174/126 R; 336/DIG. 1
[58] Field of Search .................. 335/216; 336/DIG. 1; 174/126 S, 128 S

[56] References Cited

U.S. PATENT DOCUMENTS

| | | | |
|---|---|---|---|
| 3,349,209 | 10/1967 | Zar | 335/216 X |
| 3,513,421 | 5/1970 | Schindler et al. | 335/216 |
| 3,668,581 | 6/1972 | Schrader | 335/216 |
| 4,234,861 | 11/1980 | Woolcock et al. | 335/216 |
| 4,414,428 | 11/1983 | McDonald | 174/126 |

*Primary Examiner*—George Harris
*Attorney, Agent, or Firm*—Fitch, Even, Tabin & Flannery

[57] ABSTRACT

A switch comprises a length of superconductive wire having a plurality of normally conductive stabilizing segments thereon.

8 Claims, 3 Drawing Figures

1

SPACED STABILIZING MEANS FOR A SUPERCONDUCTING SWITCH

BACKGROUND OF THE INVENTION

The present invention relates to a switch which may be shifted between a "closed" state wherein it provides a very low resistance path for electric current and an "open" state wherein it provides a relatively high resistance current path.

One use for the switch of the present invention relates to superconductive magnet coils. Such coils are typically maintained at very low temperatures in baths of liquid helium in closed vessels, such as Dewar vessels. For certain applications, it is desirable to enable selective provision of a current path having very low resistance, such as $10^{-9}$ ohms, between two points within the Dewar vessel. Conventional switches are not capable of providing current paths having such low resistance.

Superconducting materials provide very low electrical resistance at very low temperatures. Typically, a superconductive material has a transition temperature between 10° K. and 20° K., above which temperature it is a normal conductor having relatively high resistance.

In the past, it has been proposed to employ superconductors as switches by varying their temperatures. However, such switches have typically included continuous stabilizing matrices of relatively low resistance, and have typically been incapable of providing high resistance current paths when in open position.

SUMMARY OF THE INVENTION

The present invention provides a switch which includes a length of superconductive material and stabilizing means which reduce instability of the length of superconductive material without excessively reducing the resistance of the switch in its open state. In the preferred embodiment, a heater is provided which raises the temperature of the superconductive material above its transition temperature to open the switch. Insulation substantially encloses the superconductive material and heater to enable maintenance of a temperature differential between the superconductive material and the surrounding environment.

The stabilizing means preferably comprises a plurality of copper segments disposed in contact with the superconductive material. The segments are spaced from one another so as not to provide a continuous current path through the copper.

Accordingly, it is a general object of the present invention to provide an improved switch which functions as a superconductor in its closed state and as a normal conductor in its open state.

It is a further object of the present invention to provide a switch which functions as a superconductor in its closed state and which provides relatively high resistance between its terminals in open position.

Further objects and advantages of the present invention are set forth in the following description and the accompanying drawings.

DETAILED DESCRIPTION OF THE PREFERRED EMBODIMENT

Figure 1:
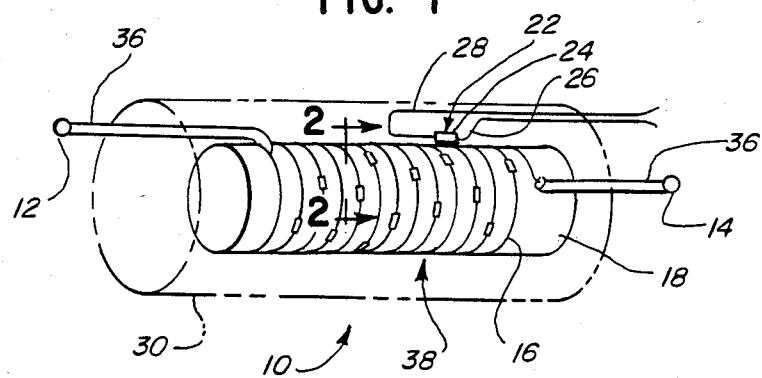
FIG. 1 is a diagrammatic view of a switch in accordance with the present invention.

The present invention is generally embodied in a switch, indicated generally at 10 in FIG. 1. The switch 10 includes first and second terminals 12 and 14. The switch includes a length 16 of superconductive material which extends between the first and second terminals 12 and 14. Herein, the length of superconductive material 16 is wound in a helical path about a core element 18. The illustrated core element 18 is a length of aluminum tubing filled with thermal insulation such as a synthetic foam material.

When the temperature of the superconductive material 16 is maintained at an extremely low temperature, it functions as a superconductor, i.e., it conducts current with extremely low resistance. At higher temperatures, the superconductive material 16 functions as a normal conductor, and conducts current with relatively high resistance. The transition temperature, at which the material makes transitions between normal and superconducting states, is typically between 10° K. and 20° K.

The switch 10 is closed by lowering the temperature of the superconductive material 16 below the transition temperature. The switch 10 is opened by raising the temperature of the superconductive material above the transition temperature.

While means for changing the temperature of the superconductive material 16 might include a heater, a cooler, or both, the illustrated switch is designed for use in an environment having an ambient temperature below the transition temperature of the superconductive material, and accordingly a heater 22 is provided for opening the switch by raising the temperature of the material above its transition temperature. When the heater 22 is not in operation, the superconductive material 16 transfers heat to the environment and changes state when its temperature becomes sufficiently low, closing the switch 10.

The illustrated heater 22 comprises a heating element 24 having relatively high electrical resistance so as to produce heat when current flows therethrough. Electric current is provided to the heating element by heater leads 26 and 28. The heating element 24 may be a conventional resistor.

To prevent excessive heat transfer from the heater 22 to the environment, thermal insulation 30 substantially encloses the length of superconductive material 16 and the heater 22. The insulation may be provided by a winding of epoxy glass ribbon.

The superconductive material herein comprises a multi-filament wire 16 composed of a plurality of niobium-titanium filaments 32 connected in parallel. During superconducting operation, a relatively small mechanical or thermal disturbance may generate heat within a filament 32 and raise the temperature of a portion of the filament above the transition temperature. When a relatively small portion of a single filament 32 is raised above the transition temperature, the resultant electrical resistance in that portion generates heat which raises the temperature of adjacent portions of the filament. To prevent such an occurrence from driving the entire wire 16 normal, i.e., raising its temperature above the transition temperature, stabilizing material is typically provided on the superconductive filaments to provide a current path around portions of the superconductive filaments which are temporarily conducting at relatively high resistance. The stabilizing material may also conduct heat away from such portions.

A superconductive cable is typically stabilized by a continuous normal conductor which is coextensive with the superconductive material therein. The normal conductor typically has higher electrical resistance than the superconductive material below the transition temperature, but lower electrical resistance than the superconductive material above the transition temperature.

Stabilizing material typically takes the form of a copper matrix which surrounds the filaments individually and collectively. Because the copper matrix has relatively low electrical resistance above the transition temperature, a copper-stabilized superconductive wire has relatively low resistance even above the transition temperature. This makes such a stabilized wire unsuitable for use in a switch where it is desired to open the switch, i.e., to provide high resistance between the ends of the superconductive wire, by raising the temperature thereof above its transition temperature.

In accordance with the present invention, stabilizing means 34 are provided for stabilizing the superconductive wire 16 while enabling relatively high resistance to be maintained between opposite ends of the wire 16 at temperatures above the transition temperature of the superconductive material. In the illustrated embodiment, the stabilizing means 34 comprises a plurality of segments of normally conductive material. The segments 34 are spaced from one another along the length of the wire 16, and each segment contacts all of the filaments 32. The segments 34 thus connect the filaments 32 in parallel, which enables current to be redistributed around portions of individual filaments which are temporarily above the transition temperature. In addition to their electrical functions, the segments 34 may also delay propagation of heat along the filaments 32, which further aids in maintaining stability. The segments 34 are preferably made of copper.

The characteristics of the switch 10 are largely dependent on the length and spacing of the copper segments 34. If the lengths of the intervals between the copper segments 34 are too great, inadequate stabilization is provided. The effectiveness of the stabilizing segments lies primarily in their ability to provide alternate paths for current when particular portions of filaments are temporarily heated above the transition temperature. As the lengths of the intervals increase, the probability increases that at some point, in time the number of filaments having such portions between two particular segments will be so great that the remaining filaments cannot carry all of the current. Should this occur, the wire 16 would be driven normal. However, if the cumulative length of the intervals is too short, the resistance of the switch 10 in open position may be undesirably low.

Another consideration is that the segments 34 should be long enough that resistance to current traveling therethrough between filaments 32 is negligible. If the segments 34 are too short, the area of contact between a segment 34 and the filaments 32 may be so low that electrical resistance to current between the filaments 32 and the segment 34 is too high.

Also, if the copper segments 34 are relatively long, heat transfer to the portions of the superconductive filaments 32 within the copper segments 34 is delayed slightly, and these portions will remain superconducting for a short period of time after the heater 22 has been activated. Similarly, when it is desired to close the switch 10, heat transfer from these portions will be delayed by the copper segments 34. Such delays are undesirable.

To provide acceptable performance herein, the superconductive wire 16 may comprise a 400 foot length of 20 mil multifilament superconductive wire, with the copper segments 34 covering about one inch per foot of the superconductive wire.

Figure 3:
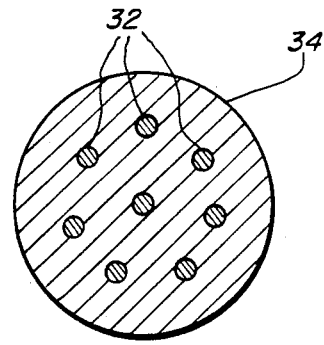
FIG. 3 is an enlarged sectional view taken substantially along line 3—3 in FIG. 2 and looking in the direction of the arrows.
Figure 2:
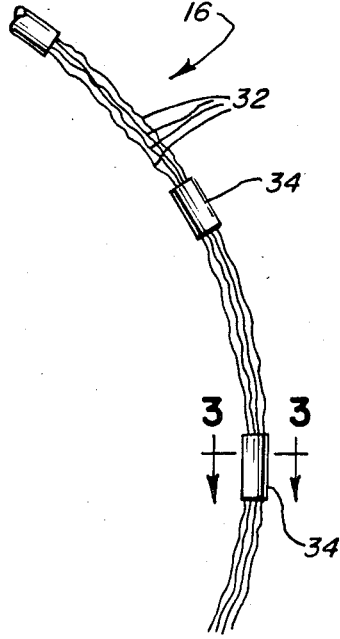
FIG. 2 is an enlarged sectional view taken substantially along line 2—2 in FIG. 1 and looking in the direction of the arrows.

The current carrying portion of the switch 10, i.e., the wire 16 and segments 34, may be manufactured from a stabilized superconductive wire by removing portions of the stabilizing material therefrom. Stabilized superconductive wire is typically manufactured by a coextrusion process whereby a plurality of superconductive filaments are enclosed within a copper matrix. Such a wire has a cross section as shown in FIG. 3 along its entire length. The coextrusion process provides good electrical contact between the copper matrix and the superconductive filaments along the entire length of the wire.

In the illustrated embodiment of the present invention, the conducting portion of the switch 10 may be made by chemically etching a length of 20 mil multifilament copper-stabilized superconductive wire to remove all but about one inch per foot of the stabilizing copper matrix over almost all of the wire, but leaving end portions 36 of the matrix intact adjacent the ends for the switch terminals 12, 14. Thus, after etching, the wound portion 38 of the wire 16 is left with a plurality of one inch segments 34 spaced at intervals of about one foot. In this embodiment of the invention, the normal state resistance, i.e., the resistance in open position, is about 1060 ohms, and the switch 10 is capable of carrying about 80 amperes when in superconducting state or closed position.

One particular application for the switch 10 described above is in enabling persistent mode operation of a superconducting magnet coil. In persistent mode operation, a magnet coil is charged, i.e., a high current is established in the coil, and then the opposite ends of the coil are connected to one another to enable current to flow continuously through the coil without requiring a power supply to maintain the current. To charge a magnet coil using the switch 10 of the present invention, the switch is installed across the magnet leads which are connected to opposite terminals of the power supply, and is driven to its normal or open state. The power supply is then activated to charge the coil. As the coil is charged, a relatively small current flows through the switch 10 in open state. This current generates sufficient heat to maintain the switch in its open state during charging of the coil.

As the current in the coil approaches its desired level, the voltage across the switch approaches zero. As this occurs the current through the switch approaches zero, which reduces generation of heat in the switch below the level necessary to keep the switch open, enabling it to be cooled rapidly by the helium bath and close, thus permitting flow of current therethrough at extremely low resistance.

Electrical connection between the opposite ends 12, 14 of the superconductive wire and the magnet leads may be provided by soldering or by spot welding. The magnet leads are typically made of copper-stabilized superconductive wire. Soldering establishes a connection between the copper on the switch wire 16 and the leads. Spot welding provides direct contact between the superconductive filaments 32 of the switch 10 and those of the magnet leads. Spot welding is generally considered less reliable as such welded connections are fragile. However, spot welding has an advantage in that it provides a connection having lower resistance.

From the foregoing, it will be appreciated that the present invention provides a novel and improved switch which functions as a superconductor when in closed position and which provides relatively high resistance to electric current when in open position. While a preferred embodiment has been illustrated and described herein, there is no intent to limit the scope of the invention to this or any particular embodiment.

What is claimed is:
1. A switch comprising:
   a length of superconductive material comprising a plurality of filaments and having a transition temperature;
   stabilizing means comprising a plurality of segments of normally conductive material spaced from one another along said length of superconductive material and in contact therewith so as to connect said filaments in parallel; and
   means for varying the temperature of said superconductive material between respective temperatures above and below its transition temperature.
2. A switch in accordance with claim 1 wherein each of said segments is about one inch in length and said segments are distributed along said length of superconductive material at intervals of about one foot.
3. A switch in accordance with claim 1 wherein said superconductive material is niobium-titanium and said normally conductive material is copper.
4. A switch in accordance with claim 1 wherein said means for varying the temperature of said superconductive material comprises an insulating enclosure substantially containing said length of superconductive material, and a heater disposed within said enclosure to transfer heat to said superconductive material.
5. A switch in accordance with claim 1 wherein said length of superconductive material is wound in a helical path.
6. A switch in accordance with claim 1 wherein said length of superconductive material comprises a multifilament superconductive wire.
7. A switch in accordance with claim 1 wherein said length of superconductive material is about 400 feet in length.
8. A switch in accordance with claim 1 further comprising an insulated core element, and wherein said superconductive material is wound thereon.

* * * * *